(12) United States Patent
Smick et al.

(10) Patent No.: US 8,378,317 B1
(45) Date of Patent: Feb. 19, 2013

(54) ION IMPLANT APPARATUS AND METHOD OF ION IMPLANTATION

(75) Inventors: Theodore Smick, Essex, MA (US); Geoffrey Ryding, Manchester, MA (US); Takao Sakase, Rowley, MA (US); William Park, Jr., Somerville, MA (US); Joseph Gillespie, Boston, MA (US); Ronald Horner, Auburndale, MA (US); Paul Eide, Stratham, NH (US)

(73) Assignee: GTAT Corporation, Nashua, NH (US)

( * ) Notice: Subject to any disclaimer, the term of this patent is extended or adjusted under 35 U.S.C. 154(b) by 2 days.

(21) Appl. No.: 13/226,590

(22) Filed: Sep. 7, 2011

(51) Int. Cl.
*A61N 5/00* (2006.01)

(52) U.S. Cl. ................... 250/492.2; 250/492.3

(58) Field of Classification Search .......... 250/396 R, 250/492.21, 397, 398
See application file for complete search history.

(56) References Cited

U.S. PATENT DOCUMENTS

| | | | |
|---|---|---|---|
| 4,155,011 A | | 5/1979 | Mark |
| 4,785,188 A | * | 11/1988 | Mori et al. ................. 250/492.2 |
| 5,084,624 A | * | 1/1992 | Lamure et al. ............. 250/492.2 |
| 5,440,132 A | * | 8/1995 | Joyner et al. ............. 250/492.21 |
| 5,932,883 A | | 8/1999 | Hashimoto et al. |
| 8,237,136 B2 | * | 8/2012 | Hautala et al. ............. 250/526 |
| 2007/0105355 A1 | * | 5/2007 | Murrell et al. ............. 438/535 |
| 2009/0166566 A1 | * | 7/2009 | Gupta et al. ............. 250/492.21 |

FOREIGN PATENT DOCUMENTS

| | | | |
|---|---|---|---|
| JP | 03266348 A | * | 11/1991 |
| JP | 03269939 A | * | 12/1991 |
| JP | 09245721 A | * | 9/1997 |
| WO | 2011008413 A | | 1/2011 |

OTHER PUBLICATIONS

Camplan, J. et al., A High Current Ion Implanter with Hybrid Scanning, Nuclear Instruments and Methods, 1980, p. 245-250, North-Holland Publishing Company.

Ruffell, John P. et al., A High Current, High Voltage Oxygen Ion Implanter, Nuclear Instruments and Methods in Physics Research, 1987, p. 229-234, B21, North-Holland, Amsterdam.

* cited by examiner

*Primary Examiner* — Jared Fureman
*Assistant Examiner* — James Choi
(74) *Attorney, Agent, or Firm* — The Mueller Law Office, P.C.

(57) ABSTRACT

An apparatus and a method of ion implantation using a rotary scan assembly having an axis of rotation and a periphery. A plurality of substrate holders is distributed about the periphery, and the substrate holders are arranged to hold respective planar substrates. Each planar substrate has a respective geometric center on the periphery. A beam line assembly provides a beam of ions for implantation in the planar substrates on the holders. The beam line assembly is arranged to direct said beam along a final beam path.

22 Claims, 6 Drawing Sheets

ION IMPLANT APPARATUS AND METHOD OF ION IMPLANTATION

BACKGROUND OF THE INVENTION

There is increasing demand for renewable energy using photovoltaic technology. In particular, photovoltaic cells are commonly formed on crystalline silicon wafers which are conventionally obtained by slicing a silicon ingot. This process, which typically yields a silicon wafer thicker than 115 μm, wastes a substantial amount of silicon by consuming up to 50% of the silicon body in kerf loss. The resulting wafers are also much thicker than is needed for useful photovoltaic devices.

Thinner silicon laminae have been made by exfoliation of film by heating after high dose ion implantation, typically with $H^+$ ions. However, to make useful silicon laminae by exfoliation for photovoltaic applications, it is necessary to implant ions at high energy, in order to create a weakness layer at sufficient depth.

Also, in order to provide relatively high productivity, it is desirable to employ high beam currents. Implant beams with an ionic current of 100 mA, and energies of 1 MeV, are now being contemplated. The effective beam power delivered to substrates being implanted can be in the order of 100 kW or higher. The need to prevent the substrates being heated by such high implant beam power to excessive temperatures presents a considerable challenge.

In a known type of ion implantation tool, a beam of ions to be implanted is directed at substrates to be implanted (typically silicon wafers) mounted in a batch around the periphery of a process wheel. The process wheel or rotary scan assembly is mounted for rotation about an axis so that the wafers on the wheel pass one after the other through the ion beam. In this way, the power of the ion beam can be shared between the wafers in the batch on the process wheel. The wafers are mounted on substrate holders on the process wheel. The substrate holders comprise a heat sinking surface for supporting the wafer. Forced cooling of the heat sinking surfaces is typically provided by means of water cooling structures.

Contact between the wafers and the heat sinking support surfaces is maintained by canting the support surfaces inwards towards the axis of rotation, whereby the wafers are pressed by centrifugal force against the support surfaces as the process wheel rotates.

The effectiveness of the cooling of the wafers in such implant apparatus using a rotary scan assembly can be dependant on the force with which wafers are pressed against the underlying heat sink surface. There are known ion implant apparatuses which provide a rotary scan assembly in the form of a drum, with the wafers mounted around the interior face of the drum, substantially facing the axis of rotation. This arrangement maximizes the effect of centrifugal force on the wafers to optimize wafer cooling during the implant process.

However, such rotary drum type ion implant apparatuses have not found favour for use when ions are to be implanted to a precise depth in the substrate. This is because the ion beam is directed at the wafers mounted around the interior of the rotary drum in a final beam direction which is at a substantial angle to the axis of rotation of the drum assembly, typically at an angle close to 90°. The resulting variation in the angle between the wafer being implanted and the implant beam, as each wafer traverses the beam on rotation of the drum, results in a substantial amount of ion channeling in the wafers being implanted. Ion channeling is a known problem where ions implanted in alignment with planes or axes of the crystal lattice of the substrate are channeled by these axes and planes to greater depths in the substrate. As a result, depth control of the implant process is prejudiced and a substantial number of implanted ions penetrate to excessive depths.

This is a significant problem for the process of exfoliation of thin wafer laminae following implantation by, for example, $H^+$ ions.

BRIEF SUMMARY

The invention provides ion implant apparatus comprising a rotary scan assembly having an axis of rotation and a periphery. A plurality of substrate holders are distributed about the periphery and the substrate holders are arranged to hold respective planar substrates. Each such substrate has a respective geometric center on the periphery.

A beam line assembly provides a beam of ions for implantation in the planar substrates on the holders and is arranged to direct the beam along a final beam path. This final beam path is defined as a line intersecting the periphery of the scan assembly at an implant position. Planar substrates on the substrate holders successively intercept the final beam path as the rotary scan assembly rotates.

The invention is further defined by reference to a Cartesian co-ordinate system having an origin at the above referred implant position. An x-axis of the co-ordinate system is defined by a tangential line which is tangential to the periphery of the rotary scan assembly and is also perpendicular to the axis of rotation. A y-axis is defined by a diametrical line perpendicular to and intersecting the axis of rotation and perpendicular to the x-axis. A z-axis is defined by an axial line parallel to the axis of rotation.

The substrate holders are arranged to hold the respective planar substrates at a wafer tilt angle $\alpha_s$ and at a wafer slope angle $\beta_s$. The wafer tilt angle $\alpha_s$ is defined as the angle of rotation of the plane of each substrate, when centered at the implant position, about the x-axis relative to the x-z plane. The wafer slope angle $\beta_s$ is defined as the angle of rotation of the substrate plane about the z-axis relative to the x-z plane.

The beam line assembly is arranged such that the final beam path has a beam tilt angle $\alpha_b$ and a beam slope angle $\beta_b$, where the beam tilt angle is defined as the angle of rotation of an x-axis beam plane, containing the final beam path and the x-axis, relative to the x-y plane of the co-ordinate system, and the beam slope angle is defined as the angle of rotation of a z-axis beam plane, containing the final beam path and the z-axis, relative to the y-z plane of the co-ordinate system.

In accordance with the invention, $$2°+\Delta\beta \leq \beta_t \leq 15°-\Delta\beta$$

where
$\beta_t = \beta_b - \beta_s$,
$2*\Delta\beta = (w_x/\pi d)*360°$,
$w_x$ is the dimension of the wafer in the x-axis direction, and
d is the diameter of the periphery of the rotary scan assembly,
and F<0.5
where
$F = 2\alpha_t * \Delta\beta/(\beta_t^2 - \Delta\beta^2 + \alpha_t^2)$, and
$\alpha_t = \alpha_b - \alpha_s$;
and
the total wafer angle $\phi \leq 45°$,
where $\sin^2\phi = \cos^2(\alpha_s)*\sin^2(\beta_s) + \sin^2(\alpha_s)$, and
the total beam to substrate normal angle $\theta \leq 15°$,
where $\sin^2\theta = \cos^2(\alpha_t)*\sin^2(\beta_t) + \sin^2(\alpha_t)$.

The invention may also provide a method of ion implantation. In the method, a rotary scan assembly having an axis for rotation is provided, the rotary scan assembly having a periphery with a diameter d. A plurality of planar substrates are held on the rotary scan assembly and are distributed about the periphery. A beam of ions for implantation in the substrates is directed along a final beam path which is defined as a line intersecting the scan assembly periphery at an implant position. The rotary scan assembly is rotated so that the planar substrates successively intercept the final beam path. A Cartesian co-ordinate system is defined as above. Each of the substrates has a dimension $w_x$ in the x-axis direction and is held on the scan assembly such that the plane of each substrate when centered at the implant position is rotated about the x and z axis by a wafer tilt angle $\alpha_s$ and a wafer slope angle $\beta_s$ as defined previously. Also, the final beam path has a beam tilt angle $\alpha_b$ and a beam slope angle $\beta_b$ as previously defined.

In accordance with the method of the invention, the values for d, $w_x$, $\alpha_s$, $\beta_s$, $\alpha_b$ and $\beta_b$ are selected in order to fulfill the conditions set out above.

In another aspect, the invention provides an ion implant apparatus comprising a rotary scan assembly having an axis of rotation and a periphery. At least 30 substrate holders are distributed about the periphery. The substrate holders are arranged to hold respective planar substrates, each having a respective geometric center and a substrate normal at the geometric center. Each planar substrate on a respective holder subtends an angle not greater than 12° about the axis of rotation.

The beam line assembly provides a beam of ions for implantation in the planar substrates on the holders. The beam line assembly is arranged to direct the beam along a final beam path, which is defined as a line intersecting the scan assembly periphery at an implant position. The planar substrates on the substrate holders successively intercept this final beam path as the rotary scan assembly rotates.

The substrate holders comprise respective heat sinks providing respective heat sinking support surfaces for the planar substrates. The support surfaces face inwards towards the axis of rotation such that the substrates are held on the support surfaces by centrifugal force as the rotary scan assembly rotates without any lateral restraint apart from friction between the substrates and the support surfaces.

The beam line assembly and the substrate holders are arranged such that the final beam path is at an acute angle not greater than 15° to the substrate normal when the geometric center of each substrate is at the implant position. This acute angle is formed by:

a) a predetermined beam slope rotation of the final beam path relative to the substrate normal about an axis parallel to the axis of rotation, the predetermined beam slope rotation being greater than half the subtended angle of each substrate, and b) a predetermined beam tilt rotation of the final beam path relative to the substrate normal about an axis tangential to the periphery and perpendicular to the axis of rotation, the predetermined beam tilt rotation being in the range zero to 10°.

The invention also provides a method of ion implantation in which at least 30 planar substrates to be implanted are mounted about the periphery of a rotary scan assembly, whereby each planar substrate subtends an angle not greater than 12° about an axis of rotation of the rotary scan assembly. A beam of ions to be implanted is directed along a final beam path to an implant position on the periphery. The scan assembly is rotated about the axis of rotation so that the planar substrates successively intercept the ion beam, geometric centers of the substrates passing through the implant position. The planar substrates are mounted on heat sinking support surfaces so as to face inwards toward the axis of rotation such that the substrates are held on the support surfaces by centrifugal force as the scan assembly rotates without any lateral restraint apart from friction between the substrates and the support surfaces. The final beam path is at an acute angle not greater than 15° to a substrate normal at the geometric center of each substrate when the geometric center is at the implant position. This acute angle is formed by a) a predetermined beam slope rotation of the final beam path relative to the substrate normal about an axis parallel to the axis of rotation, the predetermined beam slope rotation being greater than half the subtended angle of each substrate, and b) a predetermined beam tilt rotation of the final beam path relative to the substrate normal about an axis tangential to the periphery and perpendicular to the axis of rotation, the predetermined beam tilt rotation being in the range zero to 10°.

DETAILED DESCRIPTION OF THE INVENTION

In one embodiment of the implant apparatus, at least 50 substrate holders are distributed about the periphery of the rotary scan assembly adjacent to one another so that substrates on neighbouring holders do not obscure the ion beam.

In the embodiments, the substrate holders comprise respective heat sinks providing respective support surfaces for the planar substrates. Then, the support surfaces face inwards toward the axis of rotation such that the substrates are held on the support surfaces by centrifugal force as the rotary scan assembly rotates without any lateral restraint apart from friction between the substrates and the support surfaces.

In an embodiment, the beam line assembly is arranged to produce a parallel scanned beam directed along the final beam path, the direction of beam scanning being orthogonal to a direction of travel of the substrate holders through the final beam path as the rotary scan assembly rotates.

In a further embodiment, the rotary scan assembly has at least 50 substrate holders to be distributed about the periphery, whereby each planar substrate on a respective substrate holder subtends an angle not greater than about 7.2° about the axis of rotation. The predetermined beam slope rotation may be in the range of about 8° to about 11° and may be not less than about 1.5 times the subtended angle.

In an embodiment, the heat sinking support surfaces are arranged to hold the substrates such that the respective substrate normal of each substrate is at a substrate angle relative to a diameter of the rotary scan assembly through the respective geometric center. The substrate angle is less than about 45°. In another embodiment, the substrate angle is less than about 15°.

Specific applications of the ion implantation apparatus and method include the production of laminae of crystalline semiconductor material, such as silicon. Such silicon laminae may be used for the production of photovoltaic cells.

Figure 2:
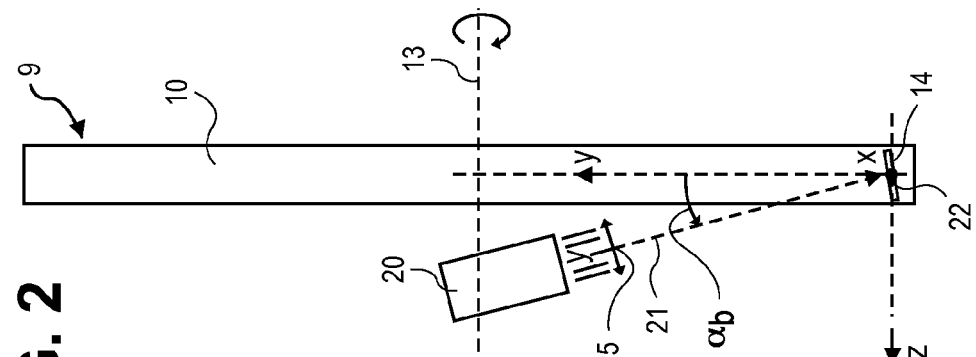
FIG. 2 is a side view of the implant apparatus of FIG. 1.
Figure 1:
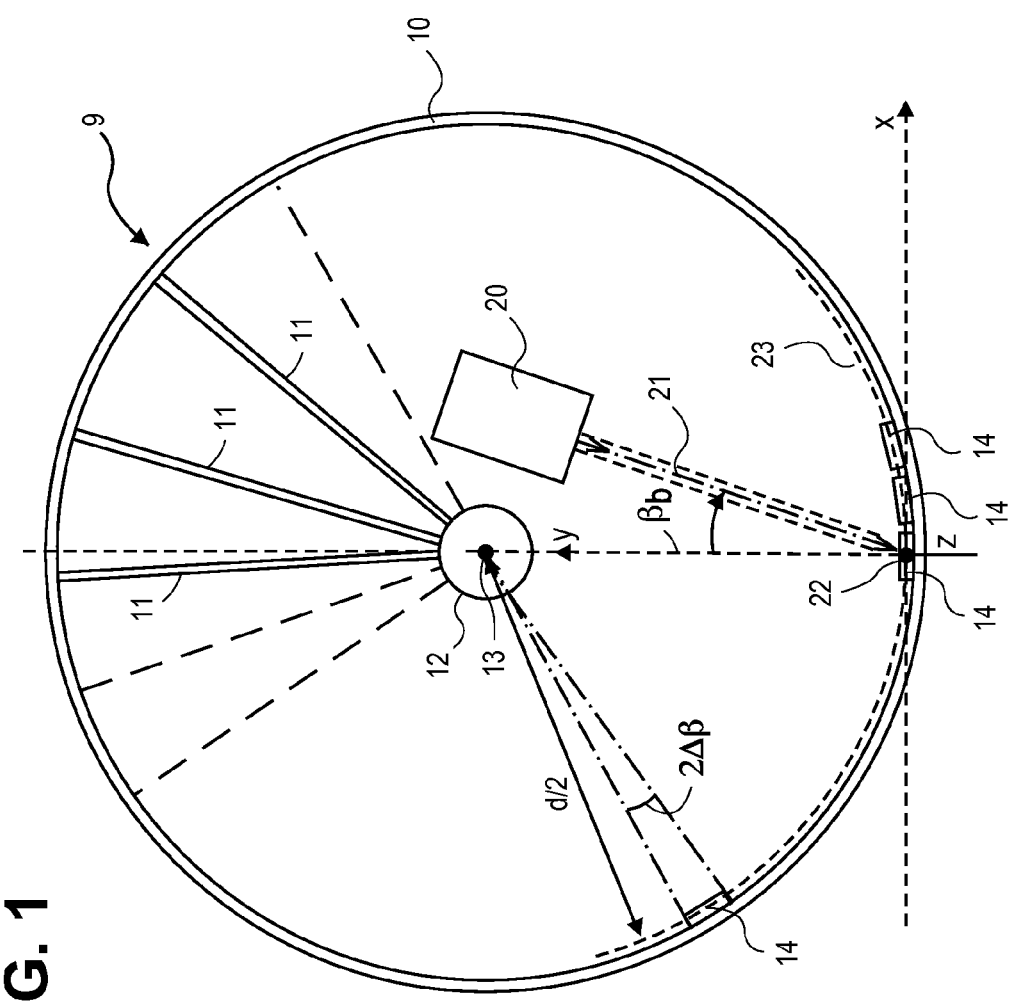
FIG. 1 is a schematic plan view of ion implant apparatus embodying the present invention.

Functional elements of an ion implanter embodying the claimed invention are illustrated schematically in FIGS. 1 and 2. The implanter comprises a rotary scan assembly 9 in the form of a wheel or drum, comprising a peripheral rim 10 supported by spokes 11 on a central hub 12 which is mounted for rotation about an axis 13. Only three spokes 11 are shown in FIG. 1 for simplicity.

Substrate holders 14 are distributed completely around the inside of the peripheral rim 10. FIG. 1 depicts only a few substrate holders 14 for simplicity. The substrate holders 14 have substrate support surfaces facing generally inward toward the axis of rotation 13 of the rotary scan assembly drum 9. Substrate wafers to be implanted can be held on the inwardly facing support services of the substrate supports 14. The substrate wafers are held against the support surfaces of the substrate holders 14 by centrifugal force when the rotary scan assembly drum 9 is rotated. By mounting substrate holders 14 around the inner periphery of the rotary scan assembly drum as shown in FIGS. 1 and 2, the force, with which the substrate wafers are pressed against the underlying support surfaces of the substrate holders 14 by the effect of centrifugal force, is maximized. This in turn improves the transfer of heat from the substrate wafers to the underlying support surfaces of the substrate holders 14, thereby facilitating excellent cooling of the substrate wafers during implant processing.

FIG. 2 is a side view of the rotary scan assembly drum 9, so that the axis of rotation 13 is in the plane of the paper. A beam line assembly 20 provides a beam of ions for implantation in the implant surfaces of the substrate wafers on the substrate holders 14. The beam of ions are directed along a final beam path 21 indicated by the dash/dot line. In FIGS. 1 and 2, the beam line assembly 20 is illustrated only schematically. Those skilled in the art of ion implantation are familiar with the essential components of an implant beam line, typically including an ion source, an accelerator assembly for accelerating ions from the source to a desired implant energy, and a magnet assembly for directing the implant beam onto the substrate wafers for implantation as required. A mass selection arrangement may also be required in the beam line assembly for selecting only the ions having the mass to charge ratio desired for implantation from the ions extracted from the ion source.

Referring to FIG. 1, substrate wafers on the substrate holders 14 each have a respective geometric center. As the rotary scan assembly drum 9 rotates, the geometric centers of the substrate wafers on the substrate holders 14 define a peripheral line 23. This peripheral line 23 is referred to throughout this Specification and Claims hereto, as the periphery of the rotary scan assembly or simply the periphery 23. As illustrated in FIGS. 1 and 2, the final beam path 21 from the beam line assembly 20 is a line which intersects the periphery 23 at a point identified as an implant position 22. It is apparent, therefore, that the geometric centers of the substrate wafers on the substrate holders 14 successively pass through the defined implant position 22, at which moment the substrate wafers are centered at the implant position.

Generally speaking, the beam line assembly 20 directs a beam of ions for implantation at the implant position 22 where the final beam path 21 intercepts the periphery 23 of the rotary scan assembly drum 9. As the rotary scan assembly drum rotates, the substrate wafers on substrate holders 14 successively intercept the final beam path 21. In this way, during an implant process, the energy of the ion beam from the beam line assembly 20 is distributed amongst the multiple substrate wafers on the substrate holders 14 around the periphery of the rotary scan assembly drum 9.

It will be appreciated by those skilled in the art that the ion beam from the beam line assembly 20 typically has a "foot print" on the substrate wafer being implanted, which is smaller than the area of the wafer. Rotation of the rotary scan assembly drum 9 is effective to scan the beam over the substrates in the direction of the periphery 23. Beam line assembly 20 may be arranged to scan the ion beam itself in a scan direction which is orthogonal to the direction of travel of substrate holders 14 through the final beam path 21 as the rotary scan assembly drum 9 rotates. This beam scanning by the beam line assembly 20 is illustrated in FIG. 2 and can be seen more clearly in FIG. 3. The beam line assembly 20 is effective to produce a parallel scanned beam, which scans to and fro in the direction indicated by the arrows 25. The beam is scanned to and fro without changing the direction of the beam which remains parallel to the final beam path 21. The beam is scanned by the beam line assembly 20 at a scan rate which is relatively high compared to the time taken for each substrate wafer to traverse the final beam path 21 during rotation of the rotary scan assembly drum 9. The ion beam is scanned parallel in the direction of the arrows 25 to a scan width, indicated by the length of the arrows 25 in FIG. 3, which is comparable to the dimension of the substrate wafer on the substrate holder 14, so that all parts of the substrate wafers are implanted.

In another embodiment, the beam line assembly 20 may produce a ribbon shaped beam having a footprint extending over the full dimension of the substrate wafers. In a further embodiment, a fixed beam extends along the final beam path 21 and two-dimensional scanning of the substrate wafers is accompanied by additionally translating the rotary scan assembly drum 9 to and fro parallel to the axis of rotation.

Figure 3:
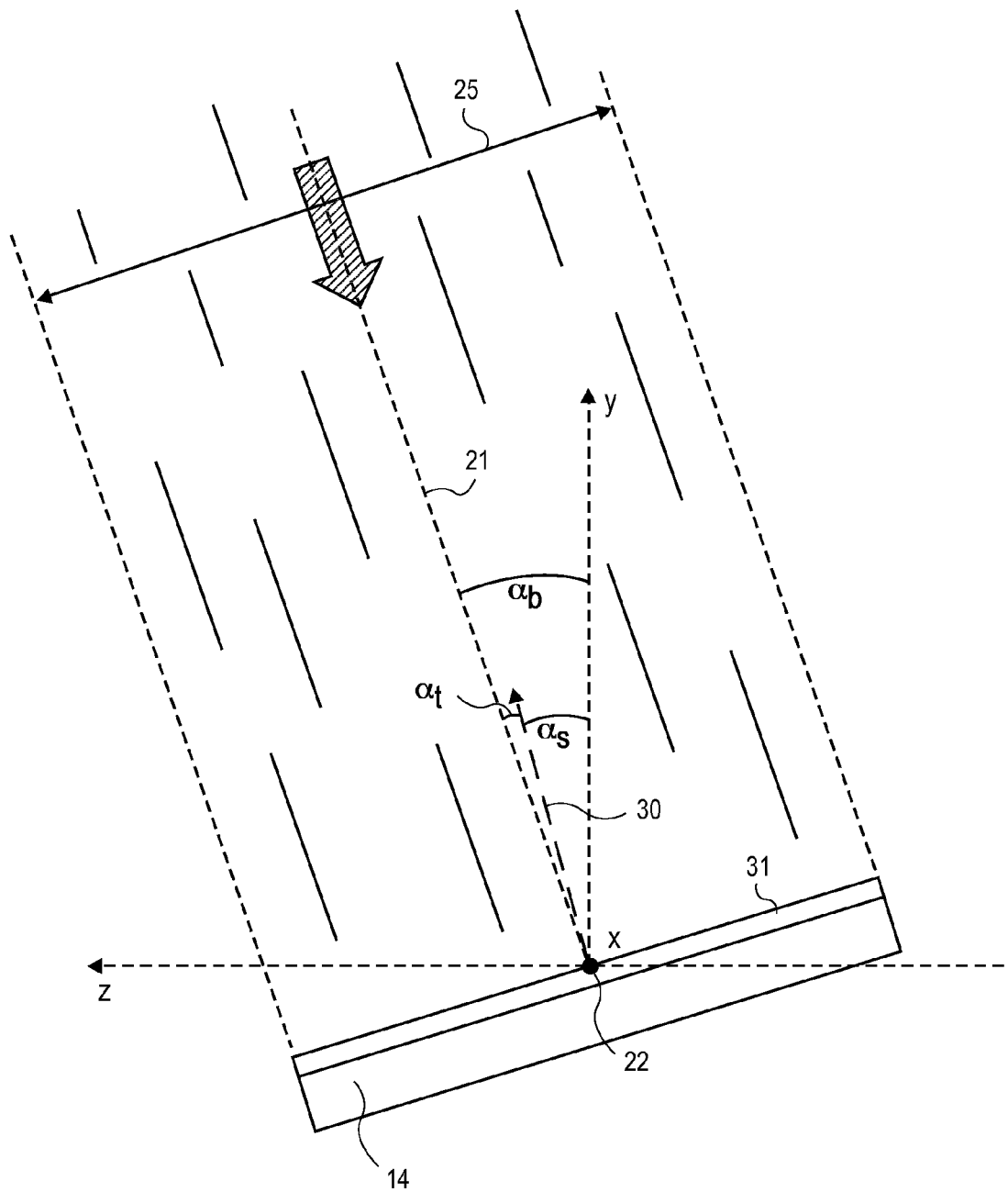
FIG. 3 is a detailed schematic view of a substrate holder of the implant apparatus of FIGS. 1 and 2, illustrating substrate tilt angle and ion beam tilt angle.
Figure 4:
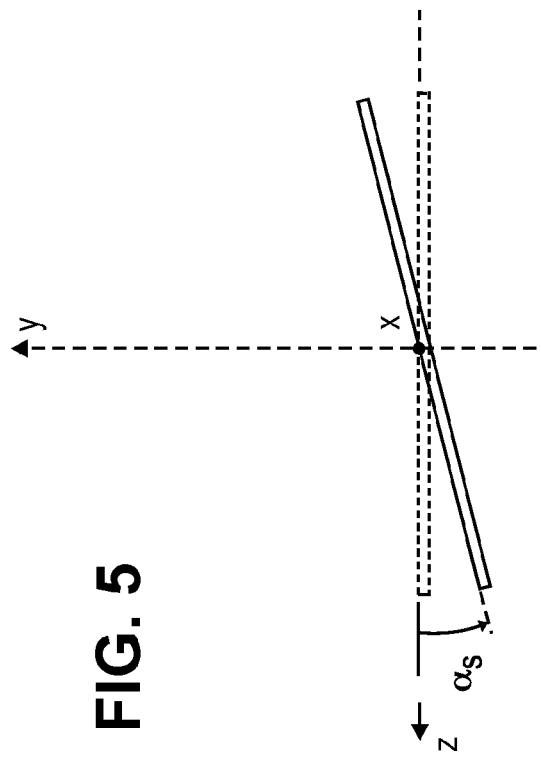
FIGS. 4, 5, 6 and 7 are schematic views of a substrate wafer illustrating substrate tilt and the substrate slope angles.
Figure 5:
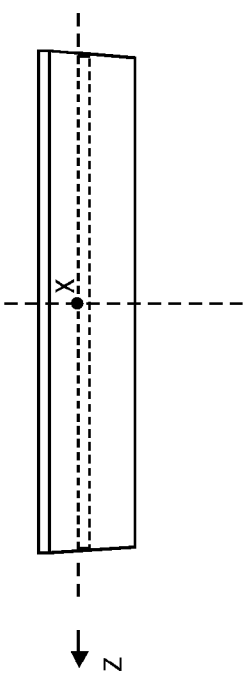

Referring to FIGS. 1, 2 and 3, a Cartesian co-ordinate system has been defined having an origin at the implant position 22 defined by the intersection of the final beam path 21 and the periphery 23. An x-axis of the co-ordinate system is provided by a tangential line forming a tangent to periphery 23. The x-axis is also perpendicular to the axis of rotation 13. A y-axis of the co-ordinate system is defined by a diametrical line perpendicular to the axis of rotation 13 and also intersecting this axis, and perpendicular to the x-axis previously defined. A z-axis is defined by an axial line which is parallel to the axis of rotation.

Referring to FIGS. 3, 4, 5, 6 and 7, the substrate holders 14 may be arranged to support the substrate wafers so as to have a wafer tilt angle $\alpha_s$ and a wafer slope angle $\beta_s$. The wafer tilt angle $\alpha_s$ is illustrated in FIG. 3 and also in FIGS. 4 and 5. In FIG. 3, a wafer normal 30 is defined as a line perpendicular to the implant surface of a substrate wafer 31 on substrate holder 14. The substrate holder 14 is holding the substrate wafer 31 with the wafer normal 30 rotated by an angle $\alpha_s$ about the x-axis (directed out of the paper in FIG. 3). This is equivalent to rotating the plane of the substrate wafer 31 by an angle $\alpha_s$ about the x-axis relative to the x-z plane, as can be best seen in FIGS. 4 and 5.

Figure 6:
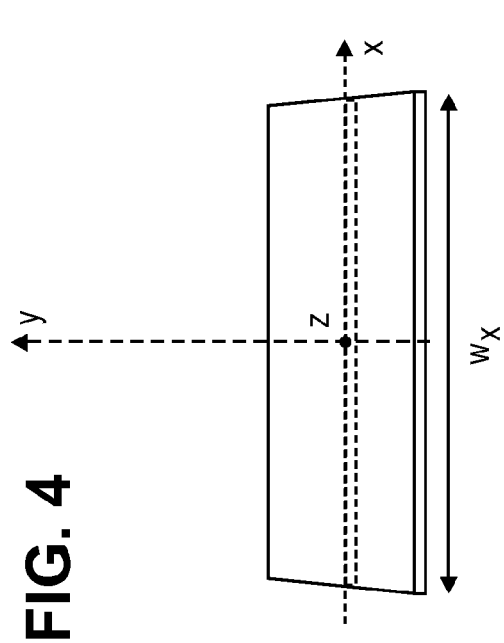
Figure 7:
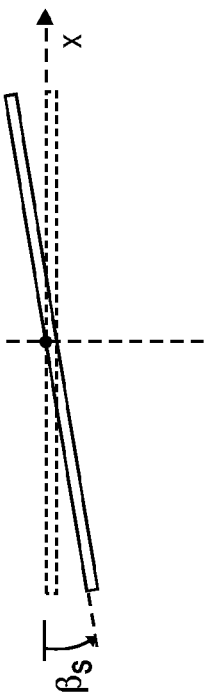

FIG. 3 illustrates only a wafer tilt rotation of the substrate wafer 31. However, it is also possible for the substrate holders 14 to hold the substrate wafers with a wafer slope rotation such as illustrated in FIGS. 6 and 7. As shown, each substrate wafer may be held on its respective substrate holder so that the plane of the wafer is rotated by an angle $\beta_s$ about the z-axis relative to the x-z plane.

A tilt rotation of the substrate wafers, as illustrated in FIG. 3, may be desirable to facilitate supporting the substrate wafers on the rotary scan assembly drum 9, particularly as the wafers are initially loaded onto the substrate supports 14 of the drum with the drum stationary. In practice, the rotary scan assembly drum 9 may be in a substantially horizontal plane, with the axis of rotation 13 substantially vertical. In such an arrangement, the defined z-axis would be pointing upwards. Then substrate wafers 31 can be supported on the substrate holders 14 and held in position by gravity in view of the tilt rotation angle $\alpha_s$. A fence arrangement at the bottom edges of the substrate holders 14 (not shown in FIG. 3) may be provided to support the wafers when being loaded. Once all wafers are loaded on the substrate holders 14, and the rotary scan assembly drum 9 is spun up to operating speed, centrifugal force takes over, pressing the substrate wafers 31 firmly against the support surfaces of the substrate supports 14. Importantly, with sufficient spin speed, the centrifugal force acting on the wafer substrates 31 is sufficient, in view of the wafer tilt angle $\alpha_s$, to overcome the force of gravity, so that the substrate wafers 31 are being pushed away from the retaining fences at the bottom edges of the substrate holders 14. However, the effect of friction between the substrate wafers 31 and the support surfaces of the substrate holders 14 is sufficient to prevent the substrate wafers 31 from sliding off the substrate holders 14.

The substrate holders 14 provide heat sinking support surfaces for the substrate wafers 31. Water cooling of the substrate holders 14 may be provided.

Referring to FIGS. 1 and 2, it can be seen that the final beam path 21 from the beam line assembly 20 has a beam tilt angle $\alpha_b$ about the x-axis relative to the x-y plane (refer to FIG. 2). Such a beam tilt angle $\alpha_b$ is desirable to enable the beam to be directed at the periphery 23 of the rotary scan assembly drum 9, without the beam line assembly 20 interfering with the support structure of the rotary scan assembly 9. Generally, the beam tilt angle $\alpha_b$ is the angle of rotation of an x-axis beam plane, containing the final beam path 21 and the x-axis, relative to the x-y plane of the co-ordinate system.

FIG. 1 also indicates the final beam path 21 is rotated by a beam slope angle $\beta_b$ about the z-axis relative to the y-z plane of the co-ordinate system. In general, the beam slope angle $\beta_b$ is the angle of rotation of a z-axis beam plane, containing the final beam path 21 and the z-axis, relative to the y-z plane of the co-ordinate system. In FIG. 1, the rotation—$\beta_b$ is given a negative sign in accordance with normal convention for rotation in a Cartesian co-ordinate system.

The full significance of a beam slope angle $\beta_b$ and/or a wafer slope angle $\beta_s$ will become apparent in the discussion that follows. Whereas prior art implanters using a rotary drum type scanning arrangement employ a combination of beam and wafer tilt angles $\alpha_s$ and $\alpha_b$, none of the prior art contemplates a beam slope angle $\beta_b$ and/or a wafer slope angle $\beta_s$, as defined above.

In the arrangement illustrated in FIG. 3, the substrate holder 14 is shown providing a wafer slope angle $\alpha_s$. In addition, the final beam path 21 is shown with a beam tilt angle $\alpha_b$. As a result, the final beam path 21 has a total tilt angle $\alpha_t$ relative to the wafer normal 30, where $\alpha_t = \alpha_b - \alpha_s$. Similarly, the total slope angle between the final beam path 21 and the wafer normal 30 is $\beta_t = \beta_b - \beta_s$.

Figure 8:
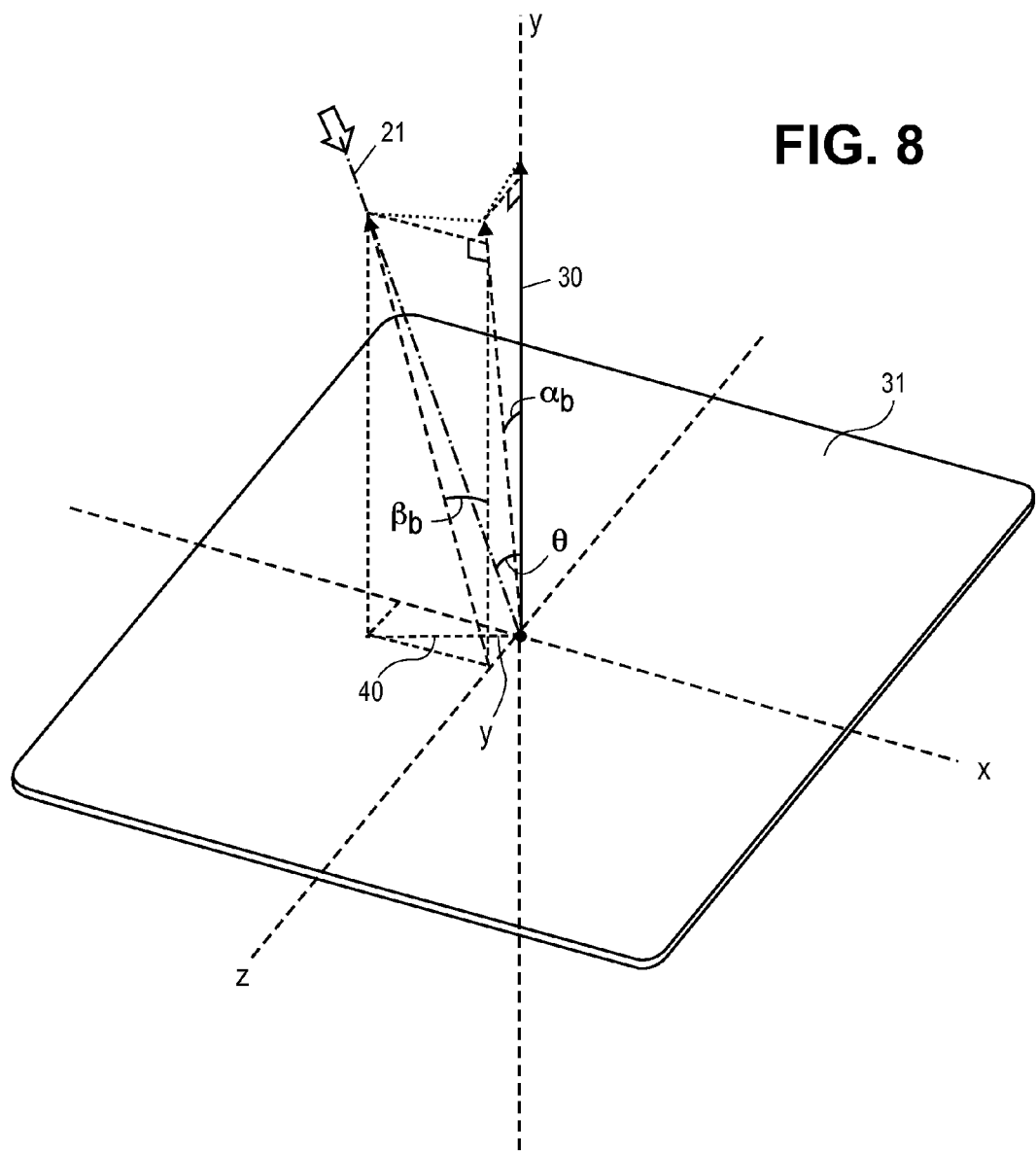
FIG. 8 is a detailed view of a substrate wafer on a substrate holder, illustrating the effect of a combination of beam tilt and beam slope angles.

FIG. 8 illustrates the effect of a combined beam tilt angle $\alpha_b$ and beam slope angle $\beta_b$. The figure shows a substrate wafer 31 aligned in the x-z plane, with its wafer normal 30 directed along the y-axis. The wafer 31 in FIG. 8 is shown having its geometrical center at the implant position corresponding to the origin of the Cartesian co-ordinate system. The final beam path 21 is shown having a beam tilt rotation $\alpha_b$ about the x-axis, and also a beam slope rotation $\beta_b$ about the z-axis. The resulting final beam path 21 makes a total angle $\theta$ relative to the substrate normal 30. The application of simple trigonometry demonstrates that:

$$\sin^2\theta = \cos^2(\alpha_b)*\sin^2(\beta_b) + \sin^2(\alpha_b). \quad (1)$$

It should be noted that in the case illustrated in FIG. 8, $\alpha_s$ and $\beta_s$ are zero; there is no wafer tilt or wafer slope. More generally:

$$\sin^2\theta = \cos^2(\alpha_t)*\sin^2(\beta_t) + \sin^2(\alpha_t). \quad (2)$$

It can be demonstrated similarly that the total angle of the wafer relative to the x-z plane (or the angle of the wafer normal to the y-axis) can be expressed as $\phi$ where:

$$\sin^2\phi = \cos^2(\alpha_s)*\sin^2(\beta_s) + \sin^2(\alpha_s).$$

Also considering FIG. 8, the final beam path 21 projects a line 40 onto the plane of the substrate wafer 31, and line 40 makes an angle $\gamma$ to the z-axis of the co-ordinate system.

Simple trigonometry establishes the relationship:

$$\sin^2\gamma = \frac{\cos^2(\alpha_b)\sin^2(\beta_b)}{\sin^2(\alpha_b) + \cos^2(\alpha_b)\sin^2(\beta_b)} \quad (3)$$

More generally:

$$\sin^2\gamma = \frac{\cos^2(\alpha_t)\sin^2(\beta_t)}{\sin^2(\alpha_t) + \cos^2(\alpha_t)\sin^2(\beta_t)} \quad (4)$$

It will be understood that for real values of $\alpha_s$ and/or $\beta_s$ the substrate wafer 31 is rotated relative to the x-z plane. The angle $\gamma$ is defined as the angle between the projection made onto the plane of the substrate wafer 31 by the final beam path 21, relative to the line of intersection between the wafer plane and the y-z plane of the co-ordinate system when the wafer is in the x-z plane. Thus, the reference line for the angle $\gamma$ on the wafer surface remains fixed as the wafer is rotated about the x and/or z axes. The angle $\gamma$ is referred to as the twist angle.

The twist angle is an important parameter for ion implantation. A known problem for ion implantation is so-called channeling. It is normally desired to ensure that ions being implanted into a substrate are implanted to a desired depth beneath the substrate surface corresponding to the energy of the ions in the implant beam. If the implant direction aligns with an axis or plane of the crystalline structure of the material of the substrate wafer (typically silicon), then channeling can occur, which allows implanted ions to be channeled along the axis or in the plane to depths in excess of the desired depth. A known procedure for minimizing channeling is to ensure that the implant beam is angled relative to the wafer normal. The wafer normal is normally aligned with a major crystal axis. Known implant processes arrange for the implant beam to be angled at about 7° to the wafer normal in order to minimize channeling.

Figure 10:
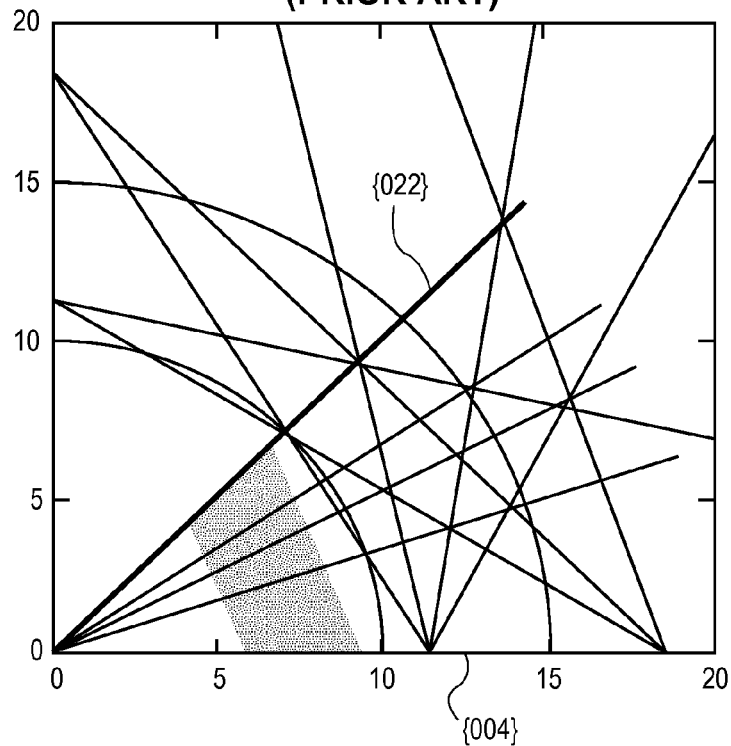
FIG. 10 is a polar diagram illustrating the range of total beam angles and twist angles in relation to crystal planes of the wafer for a prior art ion implant apparatus.
Figure 11:
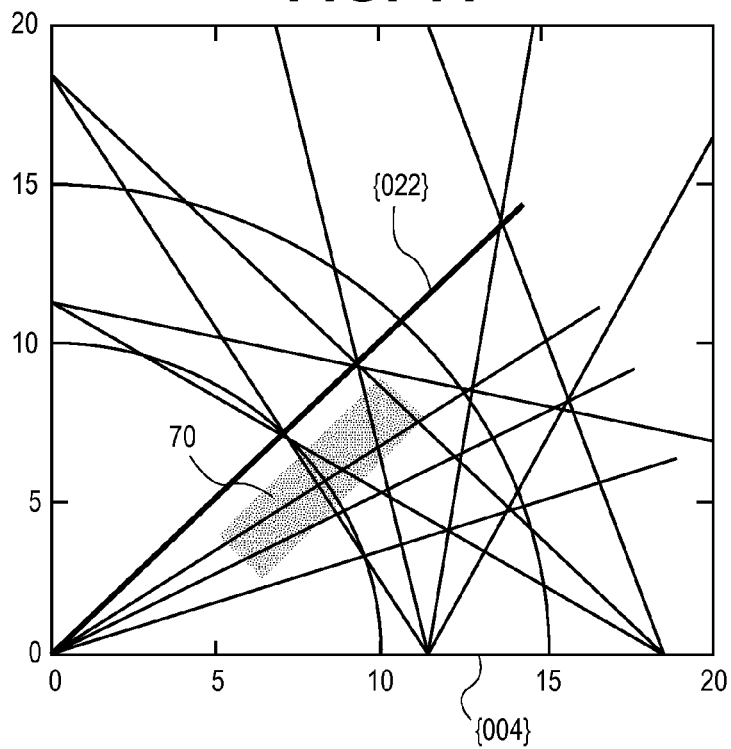
FIG. 11 is a polar diagram illustrating a range of total beam angles and twist angles for an embodiment of the invention.

However, it is also necessary to ensure that the twist angle $\gamma$ is selected to avoid implanting into crystal planes. FIGS. 10 and 11 are polar diagrams of crystal planes in crystalline silicon. The radius from the origin at the bottom left hand corner of each diagram represents the total angle $\theta$ between the beam and the wafer normal, and the angular position corresponds to the angle of twist γ between the wafer and the projection line 40 of the final beam path 21 on the wafer plane. The bottom edge of each diagram corresponds to the {004} crystal plane in the silicon lattice and the diagonal line in each diagram corresponds to the {022} crystal plane. These are the two crystal planes of primary concern and the effective twist angle γ should not coincide with these planes, so that γ should be greater than about 0° and less than about 45°.

Substrate wafers 31 mounted on the substrate holders 14 are rotated on the rotary scan assembly drum 9 as the drum rotates about the axis 13. If each substrate wafer 31 on a respective substrate holder 14 has a dimension $w_x$ (refer to FIG. 4) in the direction of the x-axis (when the wafer is centered at the implant point 22), and the diameter of the periphery 23 of the rotary scan assembly drum 9 is d, then each wafer subtends an angle $2*\Delta\beta$ about the axis 13 of rotation of the drum 9, where $2*\Delta\beta=(w_x/\pi d)*360°$. $2*\Delta\beta$ represents the amount of rotation of each substrate wafer about the z-axis as the substrate wafer 31 traverses through the beam, or more particularly through the final beam path 21.

The total slope angle $\beta_t$ is the angle between the substrate wafer 31 and the final beam path 21, when the substrate wafer 31 is centered at the implant position 22. As the substrate wafer 31 actually traverses through the implant position, with rotation of the drum 9, the slope angle varies from $\beta_t-\Delta\beta$ to $\beta_t+\Delta\beta$. This variation in slope angle has an important effect on a criterion to avoid channeling during implantation.

Figure 9:
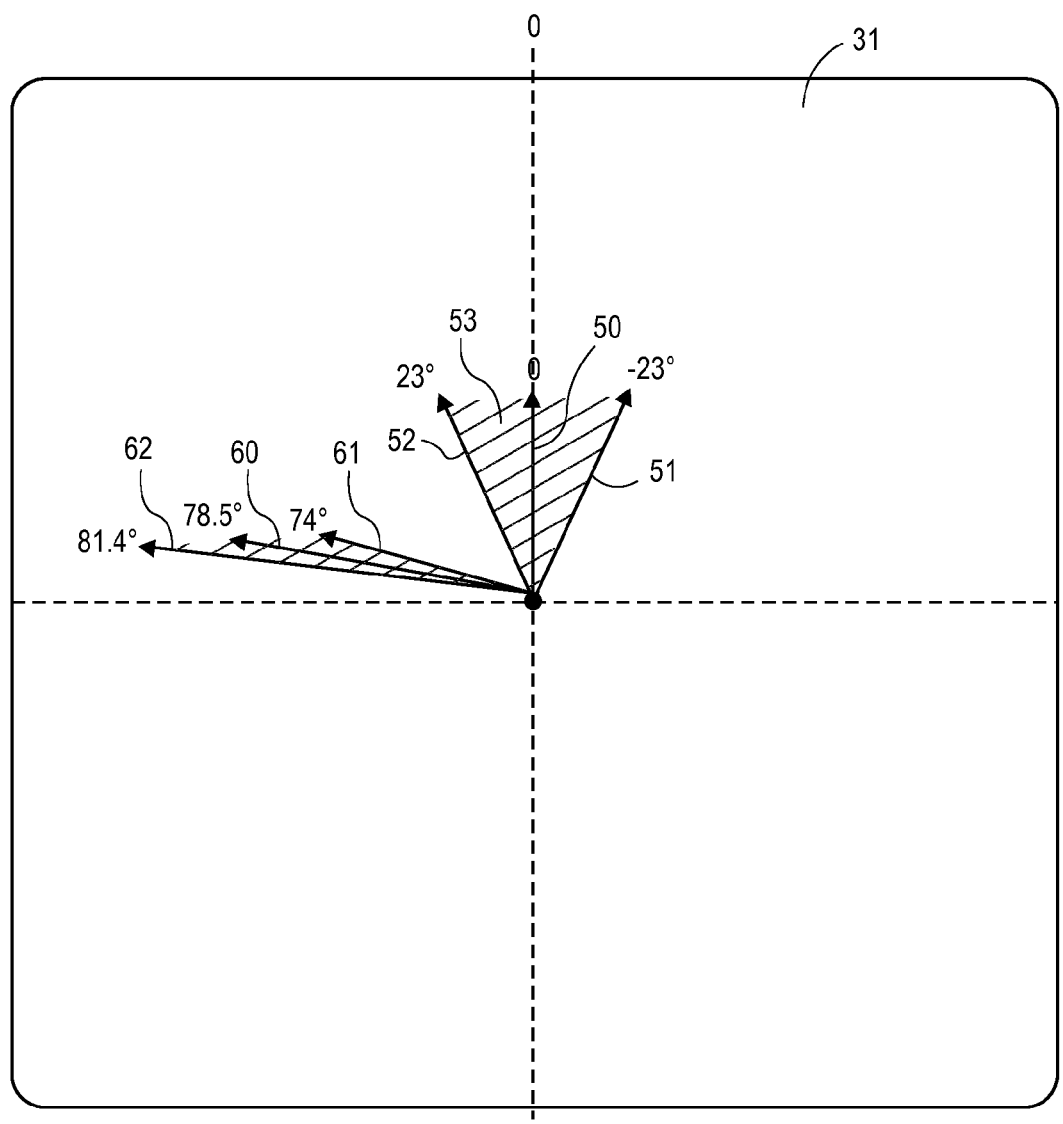
FIG. 9 is a schematic plan view of a substrate wafer illustrating the variation in beam twist angle relative to the wafer.

FIG. 9 is a schematic plan view of a substrate wafer 31. As explained previously, known prior art implanters, in which the wafers are mounted along the inside surface of a drum type rotary scan assembly, are typically set up with only a net tilt angle $\alpha_t$ between the final beam path 21 and wafers centered at the implant position. In FIG. 9, line 50 represents the projection onto the substrate wafer 31 centered at the implant position 22 of a final beam path 21 for which $\alpha_t$ is, for example, 7°, and $\beta_t$ is zero. Line 51 represents the projection of the final beam path 21 on the substrate wafer 31, when a leading edge of substrate wafer 31 first intercepts the final beam path 21. At this position, the substrate wafer 31 is effectively at a wafer slope angle of $-\beta$. Line 52 on FIG. 9, represents the projection of the final beam path 21 on the wafer plane as the trailing edge of the substrate wafer 31 is about to leave the final beam path 21. At this point, the substrate wafer 31 has an effective slope angle of $+\Delta\beta$. It can be seen, therefore, that as the substrate wafer 31 passes through the final beam path 21, from leading edge to trailing edge, the effective wafer slope angle varies from $-\Delta\beta$ through zero to $+\Delta\beta$, corresponding to the shaded region 53 on FIG. 9.

The size of the shaded region 53 is dependent on the size of $\Delta\beta$. $\Delta\beta$ is in turn dependent on the dimension of the wafer $w_x$ relative to the periphery diameter d. In practice, in order to maximize productivity, it is normal to locate substrate wafers around the periphery adjacent to each other as close as possible, without one substrate overlapping a neighbouring substrate or obscuring the ion beam as a neighbouring substrate passes through the implant point. Accordingly, the maximum value of $w_x$ is:

πd/N, where N is the number of substrate holders 14 distributed around the periphery 23 of the rotary scan assembly drum 9.

If 60 wafers are mounted around the periphery of the drum, the angle subtended by each wafer at the axis of rotation of the drum is approximately 6° (which equals $2\Delta\beta$). Referring to FIG. 9, if $\Delta\beta=3°$, and the preset tilt angle between the final beam path and the beam plane $\alpha_t$ is 7°, then the lines 51 and 52 are at approximately −23° and +23° respectively on either side of the line 50. Therefore, with such an arrangement, the twist angle of the ion beam relative to the substrate wafer varies by more than 45° as each wafer passes through the beam. Considering FIG. 10, a variation in twist angle must cause the twist angle to pass through at least one of the major channeling crystal planes {022} or {004} thus, introducing undesirable channeling in the implant process. In prior art arrangements, fewer than 60 wafers are mounted around the periphery of the drum, so that twist angle variation is greater.

Referring to FIG. 9, line 60 represents the projection onto the wafer plane of the final beam path angle, in the case of a beam path which, in accordance with an embodiment of the invention, has a preset total slope angle $\beta_t$ of about 10°. In this example, a preset tilt angle $\alpha_t$ of about 2° is also provided. The resulting twist angle γ can be calculated at about 78.5° as illustrated.

Line 61 corresponds to the projection of the final beam path as the leading edge of the wafer first intercepts the final beam path, at which point the total slope angle is about 7°, assuming as before 60 wafers around the periphery of the drum so that $\Delta\beta=3°$. The resulting twist angle is calculated at about 74°.

Line 62 represents the projection of the final beam path as the trailing edge of the wafer is about to leave the beam path, at which point the slope angle is about 13°. The resulting twist angle is calculated at about 81.4°.

With this arrangement, the twist angle of the final beam path on the wafer plane varies by about 7.5° from the leading edge to the trailing edge of each wafer as it traverses the beam. On the other hand, the total angle θ between the final beam path and the wafer plane varies, as illustrated by the lengths of the lines 60, 61 and 62, between about 8° and about 13.5°. The variation of twist angle γ and absolute beam angle θ, as represented by lines 60, 61 and 62 on FIG. 9, is illustrated in FIG. 11 by the patch 70. The patch 70 can be located within the polar diagram of FIG. 11 in a way that readily avoids overlapping one of the major implant planes {004} or {022} or symmetrically corresponding planes. Accordingly, by providing a predetermined slope angle between the final beam path and the wafer, an implant can be conducted with the apparatus described whilst avoiding significant channeling.

As mentioned above, the final beam path 21 must be angled away from the wafer normal 30 at all times during passage of the substrate wafer 31 through the beam path, to avoid the beam aligning with a primary crystal axis corresponding to the wafer normal 30. Accordingly, the total angle between the final beam path 21 and the wafer plane should not be less than about 2°.

In one embodiment, the ion implantation apparatus described herein may be used for the implantation of ions in a silicon substrate in order to cause a plane of weakness thus allowing a thin lamina of silicon to be exfoliated. The process may be utilized for the production of thin silicon laminae for use in the manufacture of photovoltaic solar cells. The thickness of the exfoliated laminae should be at least about 10 microns. This may require implant energies approaching or exceeding about 1 MeV. The depth penetration of ions during implantation varies with the cosine of the angle of implantation relative to the wafer normal. Accordingly, in order to minimize the reduction in implant depth, the angle of implantation (corresponding to angle θ in FIG. 8) should not exceed about 15° and therefore, the maximum slope angle as a substrate wafer traverses the ion beam should also not be greater than about 15°. These conditions lead to the inequality:

$$2°+\Delta\beta \leq \beta_t \leq 15°-\Delta\beta \quad (5)$$

In FIG. 9, the variation in twist angle between lines 61 and 62 is dependent on the amount of preset tilt angle ($\alpha_t$) between the wafers and the final beam path. As demonstrated previously, the twist angle γ is related to $α_t$ and $β_t$ by equation (4) above.

In order to limit the size of the patch 70 in FIG. 11, the total variation in twist angle, as a wafer traverses the ion beam, should be confined to about 30°. If this twist angle variation is $Δγ$ then $Tan(Δγ)=F$, where F is approximately equal to $2α_t * Δβ/(β_t^2 - Δβ^2 + α_t^2)$. This equation for F is a reasonable approximation for small values of $α_t$, $β_t$ and $Δβ$. In order to keep the variation and twist angle to less than about 27°, the above function F should be less than 0.5.

As mentioned above, the substrate holders 14 may be arranged to support the wafer with a tilt angle $α_s$ and a slope angle $β_s$. Substrate wafers 31 are mounted on the rotary scan assembly drum 9 facing substantially inward toward the axis of rotation of the drum. In this way, the effective centrifugal force on the substrate wafer 31, which is pushing the substrate wafer 31 against the support surfaces of the substrate holders 14, is maximized. It is also desirable that the substrate wafers 31 are held on the support surfaces of the substrate holders 14 solely by the action of centrifugal force, without any lateral restraint apart from friction between the substrate wafers 31 and the support surfaces of the substrate holders 14. Also, to provide heat transfer from the substrate wafers 31 into the substrate supports of the substrate holders 14, uniform contact pressure between the rear surface of the substrate wafers 31 and the substrate support surfaces of the substrate holders 14 over the whole surface area of the wafers should be maintained. This is made easier if there are no lateral support fences needed to hold the substrate wafers 31 in place as the rotary scan assembly drum 9 is rotated. If the total wafer angle φ exceeds about 45°, the contact pressure between the wafers and the substrate support surfaces may become less than optimum. Also, the lateral forces on the substrate wafers 31 during rotation of the rotary scan assembly drum 9 may be sufficient to overcome the effect of friction, so that the substrate wafers 31 may slide off of the substrate holders 14.

In the example described above, 60 substrate holders 14 are distributed about the periphery 23 of the rotary scan assembly drum 9. The inequality (5) above, relating $β_t$ to $Δβ$, implies a maximum value for $Δβ$ of about 6.5°. This would correspond to a minimum of about 30 substrate holders distributed about the periphery 23 of the rotary scan assembly drum 9, each subtending an angle of about 12°.

However, in order to reduce the variation in slope angle as substrate wafers 31 pass through the beam, at least 50 substrate holders 14 may be distributed about the periphery 23 of the rotary scan assembly drum 9, implying the inequality:

$$w_x \leq \pi d/50.$$

In practice, between 55 and 70 substrate holders 14 may be distributed around the periphery. If more than 70 is provided, although $Δβ$ is reduced, either the substrate dimension $w_x$ must be reduced, or the drum diameter d may become excessive for practical purposes.

With an effective value of $Δβ$ approximately equal to 3°, the total beam angle $β_t$ can be set between a minimum of about 5° and a maximum of about 12°, for example, $8° \leq β_t \leq 11°$.

In order to further confine the variation in twist angle, function F may be less than about 0.25. In one example, function F is less than 0.15.

In an example of implantation apparatus, $Δβ \leq β_t/3$. This limits the amount of variation in slope angle across the substrate wafer to about + or −33%. In turn, the variation in total implant angle θ, and consequently also in implant depth, is limited. This is desirable for reliable exfoliation of thin silicon laminae.

Generally, the total tilt angle $α_t$ should be kept rather small to reduce twist angle variation $Δγ$. In an example $α_t \leq 3°$. In another example, $Δβ<3.5°$, $α_t<3°$, and $α_s<12°$.

A variety of embodiments have been provided for clarity and completeness. Other embodiments of the invention will be apparent to one of ordinary skill in the art when informed by the present specification. Whereas detailed arrangements and ranges of parameters for implant apparatus and for an implant method have been described herein, other arrangements and parameter settings can be used which fall within the scope of the appended claims.

The foregoing detailed description has described only a few of the many forms that this invention can take. For this reason this detailed description is intended by way of illustration and not by way of limitation. It is only the following claims, including all equivalents, which are intended to define the scope of the invention.

The invention claimed is:

1. Ion implant apparatus comprising:
a rotary scan assembly having an axis of rotation and a periphery;
a plurality of substrate holders distributed about said periphery, said substrate holders being arranged to hold respective planar substrates, each having a respective geometric center on said periphery;
and a beam line assembly to provide a beam of ions for implantation in said planar substrates on said holders, said beam line assembly being arranged to direct said beam along a final beam path;
wherein said substrate holders are arranged to hold said respective planar substrates at a wafer tilt angle $α_s$ and at a wafer slope angle $β_s$;
wherein said beam line assembly is arranged such that said final beam path has a beam tilt angle $α_b$ and a beam slope angle $β_b$;
wherein $$2°+Δβ \leq β_t \leq 15°-Δβ$$

where
$β_t = β_b - β_s$,
$2*Δβ = (w_x/\pi d)*360°$,
$w_x$ is the dimension of the wafer in the x-axis direction, and
d is the diameter of said periphery of the rotary scan assembly,
and F<0.5
where
$F = 2α_t * Δβ/(β_t^2 - Δβ^2 + α_t^2)$, and
$α_t = α_b - α_s$;
and wherein
the total wafer angle $φ \leq 45°$,
where $\sin^2 φ = \cos^2(α_s) * \sin^2(β_s) + \sin^2(α_s)$, and
the total beam to substrate normal angle $θ \leq 15°$,
where $\sin^2 θ = \cos^2(α_t) * \sin^2(β_t) + \sin^2(α_t)$.

2. Ion implant apparatus as claimed in claim 1, wherein at least 50 substrate holders are distributed about said periphery of said rotary scan assembly adjacent each other so that substrates on neighbouring said holders do not obscure the ion beam, such that $w_x \leq \pi d/50$.

3. Ion implant apparatus as claimed in claim 1, wherein $8° \leq β_t \leq 11°$.

4. Ion implant apparatus as claimed in claim 3, wherein $β_s = 0°$.

5. Ion implant apparatus as claimed in claim 3, wherein

Δβ<3.5°,
α_t<3°, and
α_s<12°.

6. Ion implant apparatus as claimed in claim 1, wherein F<0.15.

7. Ion implant apparatus as claimed in claim 6, wherein Δβ≦β_s/3.

8. Ion implant apparatus as claimed in claim 1, wherein α_t≦3°.

9. Ion implant apparatus as claimed in claim 1, wherein said substrate holders comprise respective heat sinks providing respective support surfaces for said planar substrates, and wherein said support surfaces face inwards towards said axis of rotation such that said substrates are held on said support surfaces by centrifugal force as said rotary scan assembly rotates without any lateral restraint apart from friction between said substrates and said support surfaces.

10. Ion implant apparatus as claimed in claim 1, wherein said beam line assembly is arranged to produce a parallel scanned beam directed along said final beam path, and wherein said direction of beam scanning is orthogonal to a direction of travel of said substrate holders through said final beam path as said rotary scan assembly rotates.

11. Ion implant apparatus comprising:
a rotary scan assembly having an axis of rotation and a periphery;
at least 30 substrate holders distributed about said periphery, said substrate holders being arranged to hold respective planar substrates, each having a respective geometric center and a substrate normal at said geometric center, wherein each said planar substrate on a respective one of said holders subtends an angle not greater than 12° about said axis of rotation;
and a beam line assembly to provide a beam of ions for implantation in said planar substrates on said holders, said beam line assembly being arranged to direct said beam along a final beam path, said final beam path being defined as a line intercepting said scan assembly periphery at an implant position, said planar substrates on said substrate holders successively intercepting said final beam path as said rotary scan assembly rotates;
wherein said substrate holders comprise respective heat sinks providing respective heat sinking support surfaces for said planar substrates;
wherein said support surfaces are facing inwards towards said axis of rotation such that said substrates are held on said support surfaces by centrifugal force as said rotary scan assembly rotates, without any lateral restraint apart from friction between said substrates and said support surfaces;
wherein said beam line assembly and said substrate holders are arranged such that said final beam path is at an acute angle not greater than 15° to said substrate normal when said geometric center of each said substrate is at said implant position; and
wherein said acute angle is formed by:
a) a predetermined beam slope rotation of said final beam path relative to said substrate normal about an axis parallel to said axis of rotation, said predetermined beam slope rotation being greater than half of a subtended angle of each said substrate, and
b) a predetermined beam tilt rotation of said final beam path relative to said substrate normal about an axis tangential to said periphery and perpendicular to said axis of rotation, said predetermined beam tilt rotation being in the range of zero to 10°.

12. Ion implantation apparatus as claimed in claim 11, wherein said rotary scan assembly has at least 50 substrate holders distributed about said periphery, whereby each said planar substrate on a respective one of said substrate holders subtends an angle not greater than 7.2° about said axis of rotation.

13. Ion implantation apparatus as claimed in claim 12, wherein said predetermined beam tilt rotation is not more than 3°.

14. Ion implantation apparatus as claimed in claim 11, wherein said predetermined beam slope rotation is in the range 8° to 11°.

15. Ion implantation apparatus as claimed in claim 11, wherein said predetermined beam slope rotation is not less than one and a half times said subtended angle.

16. Ion implantation apparatus as claimed in claim 11, wherein said heat sinking support surfaces are arranged to hold said substrates such that the respective substrate normal of each of said substrates is at a substrate angle relative to a diameter of said rotary scan assembly through the respective geometric center, said substrate angle being less than 45°.

17. A method of ion implantation comprising the steps of:
mounting at least 30 planar substrates to be implanted about the periphery of a rotary scan assembly, whereby each said planar substrate subtends an angle not greater than 12° about an axis of rotation of said rotary scan assembly;
directing a beam of ions to be implanted along a final beam path to an implant position on said periphery;
and rotating said scan assembly about said axis of rotation so that said planar substrates successively intercept said ion beam, geometric centers of said substrates passing through said implant position;
wherein said planar substrates are mounted on heat sinking support surfaces so as to face inwards towards said axis of rotation such that said substrates are held on said support surfaces by centrifugal force as said scan assembly rotates without any lateral restraint apart from friction between said substrates and said support surfaces;
wherein said final beam path is at an acute angle not greater than 15° to a substrate normal at said geometric center of each respective substrate when said geometric center is at said implant position; and
wherein said acute angle is formed by:
a) a predetermined beam slope rotation of said final beam path relative to said substrate normal about an axis parallel to said axis of rotation, said predetermined beam slope rotation being greater than half of a subtended angle of each said substrate, and
b) a predetermined beam tilt rotation of said final beam path relative to said substrate normal about an axis tangential to said periphery and perpendicular to said axis of rotation, said predetermined beam tilt rotation being in the range zero to 10°.

18. A method as claimed in claim 17, wherein at least 50 said planar substrates are mounted about the periphery of said rotary scan assembly, whereby each said planar substrate subtends an angle not greater than 7.2° about said axis of rotation.

19. A method as claimed in claim 18, wherein said predetermined beam tilt rotation is not more than 3°.

20. A method as claimed in claim 17, wherein said predetermined slope rotation is in the range 8° to 11°.

21. A method as claimed in claim 17, wherein said predetermined slope rotation is not less than one and a half times said subtended angle.

22. A method as claimed in claim 17, wherein said planar substrates are held on said heat sinking support surfaces such that the respective substrate normal of each of said substrates is at a substrate angle relative to a diameter of said rotary scan assembly through the respective geometric center, said substrate angle being less than 15°.

* * * * *